(12) United States Patent
Jung

(10) Patent No.: US 10,816,897 B2
(45) Date of Patent: Oct. 27, 2020

(54) IMPRINT TEMPLATES AND METHODS FOR FORMING IMPRINTED PATTERNS USING THE SAME

(71) Applicant: SK hynix Inc., Gyeonggi-do (KR)

(72) Inventor: Wooyung Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 328 days.

(21) Appl. No.: 15/789,019

(22) Filed: Oct. 20, 2017

(65) Prior Publication Data

US 2018/0299772 A1    Oct. 18, 2018

(30) Foreign Application Priority Data

Apr. 17, 2017   (KR) .......................... 10-2017-0049404

(51) Int. Cl.
*G03F 7/00*    (2006.01)

(52) U.S. Cl.
CPC ................................. *G03F 7/0002* (2013.01)

(58) Field of Classification Search
CPC .................................................... G03F 7/0022
USPC ....................................................... 101/488
See application file for complete search history.

(56) References Cited

U.S. PATENT DOCUMENTS

| | | | |
|---|---|---|---|
| 6,653,030 B2 * | 11/2003 | Mei ....................... | B82Y 10/00 257/E21.026 |
| 8,946,093 B2 | 2/2015 | Mikami | |
| 2006/0177535 A1 * | 8/2006 | McMackin ............ | B82Y 10/00 425/385 |
| 2006/0266244 A1 * | 11/2006 | Kruijt-Stegeman ...... | B41F 1/18 101/485 |
| 2007/0104813 A1 * | 5/2007 | Wuister ................. | B82Y 40/00 425/174.4 |
| 2010/0330807 A1 * | 12/2010 | Kobayashi ............. | B82Y 10/00 438/689 |
| 2013/0078820 A1 * | 3/2013 | Mikami ................ | G03F 7/0002 438/778 |
| 2015/0221501 A1 * | 8/2015 | Tsuji ..................... | G03F 7/0002 264/447 |
| 2016/0336503 A1 * | 11/2016 | Kasichainula .......... | H01L 35/08 |
| 2016/0357109 A1 * | 12/2016 | Jain ....................... | G03F 7/0397 |

FOREIGN PATENT DOCUMENTS

KR     1020150112945    10/2015

\* cited by examiner

*Primary Examiner* — Anthony H Nguyen
(74) *Attorney, Agent, or Firm* — IP & T Group LLP

(57) ABSTRACT

Methods for forming imprinted patterns using an imprint template. The imprint template may include at least an imprint portion and a photomask portion. The imprint portion may Include imprinting patterns. The imprinting patterns may be transferred into a first imprint shot region of a resist layer. The photomask portion may include light blocking patterns. The light blocking patterns may provide a light permeation area corresponding to a boundary region defining a second imprint shot region of the resist layer.

12 Claims, 16 Drawing Sheets

IMPRINT TEMPLATES AND METHODS FOR FORMING IMPRINTED PATTERNS USING THE SAME

CROSS-REFERENCE TO RELATED APPLICATIONS

The present application claims priority under 35 U.S.C 119(a) to Korean Application No. 10-2017-0049404, filed on Apr. 17, 2017, which is herein incorporated by references in its entirety.

BACKGROUND

1. Technical Field

Various embodiments of the present disclosure relate to a nanoimprint lithography (NIL) technique and, more particularly, to imprint templates used in the NIL technique and methods for forming imprinted patterns using the imprint templates.

2. Related Art

In the semiconductor industry, a lot of effort has been focused on developing technologies for transferring fine pattern images onto a wafer in order to realize integrated circuits with a high integration density. A NIL technique has been evaluated as an attractive lithography technique which is efficiently usable for fabrication of nanostructures at a low cost. According to a typical NIL technique, a template in which the nanostructures are carved may be put on a resist layer and the template may be pressed toward the resist layer to transfer the nanostructures into the resist layer. The resist layer may be formed by spin-coating or dispensing a resist material onto a wafer or a substrate. The template may be fabricated using a stamp or a mold.

When the template having carved nanostructures is pressed toward the resist layer to transfer the pattern shapes of the carved nanostructures into the resist layer, portions of the resist layer may extrude or flow out of the template to contaminate sidewalls of the template or to provide an undesired surface profile of a residual resist layer that is, the patterned or carved resist layer, after the carved nanostructures of the template are transferred into the resist layer. As a result, the residual resist layer may have a non uniform surface profile which may cause a process failure. Alternatively, the residual resist layer may have protruded structures at a surface of the residual resist layer. The non-uniform surface profile of the residual resist layer or the protruded structures of the residual resist layer may lead to abnormal patterns.

SUMMARY

According to an embodiment, an imprint template includes an imprint portion and a photomask portion. The imprint portion includes imprinting patterns which are transferred into a first imprint shot region of a resist layer. The photomask portion includes light blocking patterns that provide a light permeation area corresponding to a boundary region defining a second imprint shot region of the resist layer.

According to another embodiment, there is provided a method for forming imprinted patterns. The method includes loading an imprint template on a resist layer. The imprint template is provided to include an imprint portion in which imprinting patterns are disposed and a photomask portion in which light blocking patterns are disposed to provide a light permeation area between the light blocking patterns. A first imprint step is performed to embed the imprinting patterns into a first imprint shot region of the resist layer. An exposure light is irradiated onto the imprint template to cure the first imprint shot region with the exposure light passing through the imprint portion of the imprint template. While the exposure light is irradiated onto the imprint template, a boundary region of the resist layer defining a second imprint shot region of the resist layer is cured by the exposure light passing through the light permeation area to form an extrusion barrier pattern.

According to yet another embodiment, there is provided a method for forming imprinted patterns. The method includes forming a resist layer on a wafer, providing an imprint template including an imprint portion in which imprinting patterns are disposed and a photomask portion in which light blocking patterns are disposed to provide a light permeation area between the light blocking patterns, aligning the imprint template with the wafer so that the light permeation area vertically overlaps with an edge portion of the wafer and the imprinting patterns are located outside of the wafer without vertically overlapping with the wafer, curing a boundary region of the resist layer with an exposure light passing through the light permeation area to form a first extrusion barrier pattern defining a first imprint shot region in the resist layer, realigning the imprint template with the wafer so that the imprinting patterns are located over the first imprint shot region, performing a first imprint step to embed the imprinting patterns into the first imprint shot region, and irradiating the exposure light onto the imprint template to cure the first imprint shot region with the exposure light passing through the imprint portion of the imprint template and to cure another boundary region of the resist layer defining a second imprint shot region of the resist layer with the exposure light passing through the light permeation area to form a second extrusion barrier pattern.

According to still another embodiment, there is provided a method for forming imprinted patterns. The method includes forming a resist layer on a wafer, irradiating an exposure light onto a boundary region of the resist layer using a digital micro-mirror device (DMD) to form a first extrusion barrier pattern defining a first imprint shot region in the resist layer, providing an imprint template including an imprint portion in which imprinting patterns are disposed and a photomask portion in which light blocking patterns are disposed to provide a light permeation area between the light blocking patterns, aligning the imprint template with the wafer so that the imprinting patterns are located over the first imprint shot region, performing a first imprint step to embed the imprinting patterns into the first imprint shot region, and irradiating the exposure light onto the imprint template to cure the first imprint shot region with the exposure light passing through the imprint portion of the imprint template and to cure another boundary region of the resist layer defining a second imprint shot region of the resist layer with the exposure light passing through the light permeation area to form a second extrusion barrier pattern.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
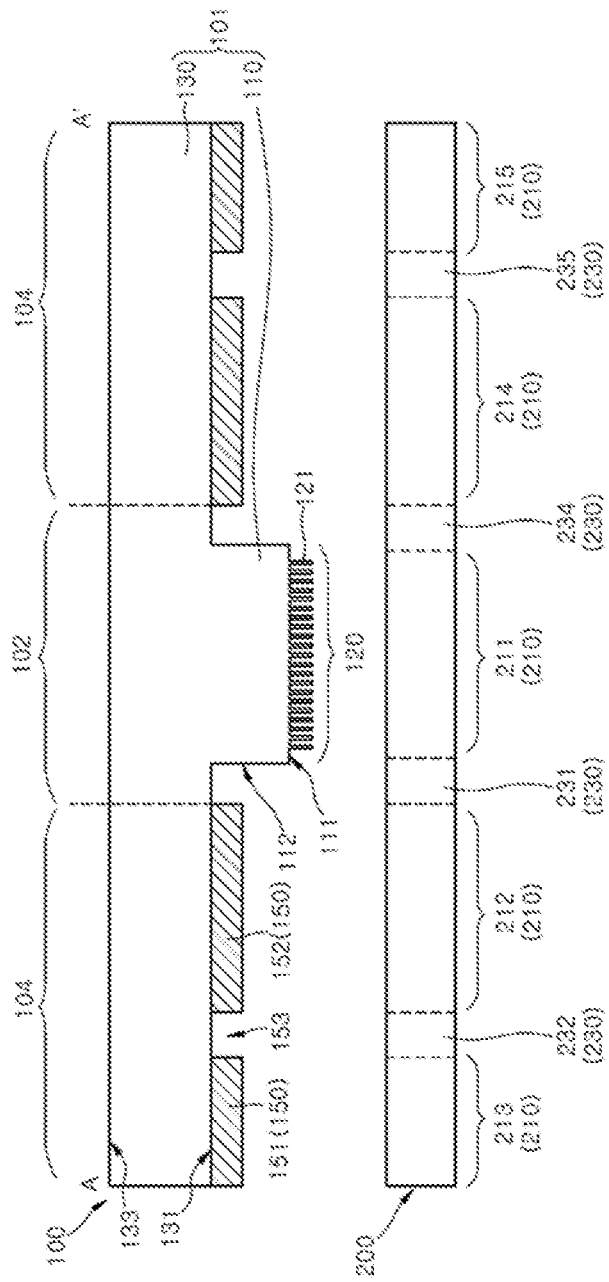
FIG. 1 is a cross-sectional view illustrating an imprint template in accordance with an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the inventive concept.

It will also be understood that when an element, or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g. "between" versus "directly between" or "adjacent" versus "directly adjacent").

The following embodiments may be applied to realization of integrated circuits such as dynamic random access memory (DRAM) devices phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
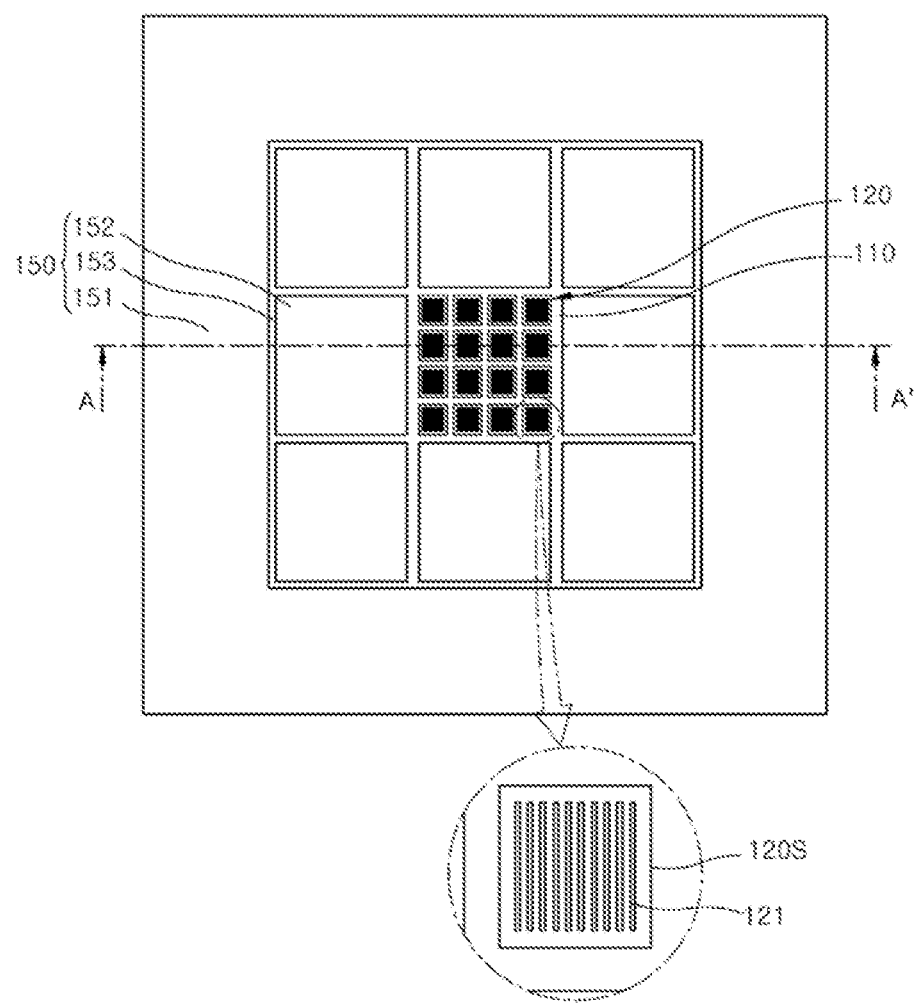
FIG. 2 is a plane view illustrating an imprint template shown in FIG. 1.

FIG. 1 is a cross-sectional view illustrating an imprint template 100 according to an embodiment, and FIG. 2 is a plane view illustrating the imprint template 100 of FIG. 1. FIG. 1 is a cross-sectional view taken along a line A-A' of FIG. 2.

Referring to FIG. 1, the imprint template 100 may include an imprint portion 102 in which imprinting patterns 121 are disposed. The imprint template 100 may further include a photomask portion 104 surrounding the imprint portion 102. That is, the photomask portion 104 may be located at edge portions of the imprint template 100, and the imprint portion 102 may be located at a central portion of the imprint template 100. The imprint portion 102 and the photomask portion 104 may constitute the imprint template 100.

The imprint template 100 may include a template body 101, the imprinting patterns 121 and light blocking patterns 150 disposed on the template body 101. The template body 101 may be comprised of a substantially transparent material. For example, the template body 101 may be formed to include a glass material such as a quartz material. The template body 101 may include a base portion 130 having a substantially flat shape and a mesa portion 110 protruding from a portion of the base portion 130 toward a resist layer 200.

The mesa portion 110 may protrude from a portion of a front side surface 131 of the base portion 130, and the base portion 130 may have a backside surface 133 opposite to the mesa portion 110. The mesa portion 110 may be disposed in the imprint portion 102 of the imprint template 100. The mesa portion 110 may have a patterned surface 111 facing the resist layer 200. The patterned surface 111 of the mesa portion 110 may have a concave and convex surface profile to provide the imprinting patterns 121. The light blocking patterns 150 may be disposed on the front side surface 131 of the base portion 130 in the photomask portion 104, and a space between the light blocking patterns 150 may correspond to a light permeation area 153. There may be a level difference between the front side surface 131 of the base portion 130 and the patterned surface 111 of the mesa portion 110. The front side surface 131 of the base portion 130 may be connected to the patterned surface 111 of the mesa portion 110 by a sidewall 112 of the mesa portion 110.

A shape of the imprinting patterns 121 defined by the patterned surface 111 of the mesa portion 110 may be transferred into the resist layer 200.

Referring to FIG. 2, a field region 120 comprised of the imprinting patterns 121 may have a tetragonal shape or a square shape surrounded by the light blocking patterns 150. The field region 120 may be divided into a plurality of sub-field regions 120S. Each of the plurality of sub-field regions 120S may include some of the imprinting patterns 121. The sub-field regions 120S may be disposed to be spaced apart from each other by a certain distance at the patterned surface 111 of the mesa portion 110.

Referring to FIGS. 1 and 2, first light blocking patterns 152 of the light blocking patterns 150 may be disposed to be adjacent to the field region 120, and each of the first light blocking patterns 152 may have a tile-shaped feature. The first light blacking patterns 152 may be disposed to surround the field region 120, and each of the first light blocking patterns 152 may have substantially the same planar shape as the field region 120. That is, each of the first light blocking patterns 152 may have substantially the same planar area as the field region 120. Accordingly the number of the first light blocking patterns 152 surrounding the field region 120 may be eight. The first light blocking patterns 152 may be disposed to be spaced apart from each other by a certain distance. A space between adjacent two patterns of the first light blocking patterns 152 may correspond to the light permeation area 153.

A second light blocking pattern 151 of the light blocking patterns 150 may be disposed to surround the first light blocking patterns 152 and to have a frame-shaped feature in a plane view. That is, the second light blocking pattern 151 may be disposed on edges of the base portion 130 of the imprint template 100. Accordingly, the second light blocking pattern 151 may have a rectangular closed loop shape to surround the first light blocking patterns 152. The second light blocking pattern 151 may be spaced apart from the first light blocking patterns 152 by a certain distance. A space between the second light blocking pattern 151 and adjacent one pattern of the first light blacking patterns 152 may correspond to the light permeation area 153.

Referring again to FIG. 2, the light permeation area 153 may be defined as a space between the first and second light blocking patterns 152 and 151 as well as between the field region 120 and the first light blocking patterns 152. Thus, the light permeation area 153 may have a lattice shape that is, a grid shape. Each of the first light blocking patterns 152 may have substantially the same shape and area as the field region 120. That is, if the resist layer 200 is exposed using the imprint template 100 as a photomask to define a plurality of non-exposed regions corresponding to the first light blocking patterns 152 in the resist layer 200 and the imprint template 100 is shifted by a pitch size of the first light blocking patterns 152, the field region 120 of the shifted imprint template 100 may be aligned to completely overlap with any one of the not exposed regions. Accordingly, the light permeation area 153 may correspond to a boundary area for defining a plurality of shot regions in which the field region 120 is sequentially stepped and imprinted during a nanoimprint lithography (NIL) process.

Referring again to FIG. 1, the field region 120 of the imprint template 100 may correspond to any one of imprint shot regions 210 of the resist layer 200. That is, the imprinting patterns 121 of the field region 120 of the imprint template 100 may be sequentially and repeatedly imprinted into the imprint shot regions 210 of the resist layer 200 during the NIL process. The imprint shot regions 210 of the resist layer 200 may be defined by a boundary region 230. In such a case, the boundary region 230 may be set by the light permeation area 153 defined in the photomask portion 104 of the imprint template 100.

When the field region 120 of the imprint template 100 is located to vertically overlap with a first imprint shot region 211 among the imprint shot regions 210 of the resist layer 200, a second imprint shot region 212 of the imprint shot regions 210, which is adjacent to the first imprint shot region 211, may be separated from the first imprint shot region 211 by a first boundary region 231 of the boundary region 230. A fourth imprint shot region 214 of the imprint shot regions 210, which is adjacent to a side of the first imprint shot region 211 opposite to the second imprint shot region 212, may be separated from the first imprint shot region 211 by a third boundary region 234 of the boundary region 230. The first imprint shot region 211 may be defined by the first and third boundary regions 231 and 234. In addition, a third imprint shot region 213 located a side of the second imprint shot region 212 opposite to the first imprint shot region 211 may be separated from the second imprint shot region 212 by a second boundary region 232 of the boundary region 230. A fifth imprint shot region 215 located a side of the fourth imprint shot region 214 opposite to the first imprint shot region 211 may be separated from the fourth imprint shot region 214 by a fourth boundary region 235 of the boundary region 230.

In the event that the field region 120 of the imprint template 100 is aligned to vertically overlap with the first imprint shot region 211 of the resist layer 200, a portion of the light permeation area 153 in the photomask portion 104 of the imprint template 100 may be aligned with the second boundary region 232 in the resist layer 200. In such a case, if an exposure light is irradiated onto the resist layer 200 through the light permeation area 153 of the imprint template 100 the exposure light may selectively reach the second boundary region 232 and the second boundary region 232 may be cured by the exposure light to function as an extrusion barrier pattern.

While the imprinting patterns 121 in the imprint portion 102 of the imprint template 100 are imprinted into the first imprint shot region 211 of the resist layer 200 after the imprinting patterns 121 are imprinted into the fourth imprint shot region 214 of the resist layer 200, the photomask portion 104 of the imprint template 100 may be used to selectively expose the second boundary region 232 of the resist layer 200 to the exposure light to cure the second boundary region 232. Since the second boundary region 232 selectively cured by exposure light acts as an extrusion barrier pattern, the cured second boundary region 232 may prevent the resist material in the second imprint shot region 212 from extruding toward the third imprint shot region 213 when the imprinting patterns 121 of the imprint template 100 are imprinted into the second imprint shot region 212 of the resist layer 200. The photomask portion 104 may be used to cure the boundary region 230 before the imprinting patterns 121 of the imprint template 100 are imprinted into the imprint shot regions 210 adjacent to the boundary region 230. While the boundary region 230 of the resist layer 200 is cured, the light blocking patterns 150 may cover the imprint shot regions 210 of the resist layer 200 to prevent the imprint shot regions 210 from being exposed to the exposure light.

The light blocking patterns 150 may be disposed to block the exposure light, for example, an ultraviolet (UV) ray passing through the base portion 130 of the imprint template 100. Thus, no UV ray may be irradiated onto the imprint shot regions 210 corresponding to the light blocking patterns 150 while the imprinting patterns 121 of the imprint template 100 are imprinted into the imprint shot regions 210 of the resist layer 200. Accordingly, while the imprinting patterns 121 are imprinted into the first imprint shot region 211 of the resist layer 200 after the imprinting patterns 121 are imprinted into the fourth imprint shot region 214 of the resist layer 200, the second boundary region 232 may be cured in advance whereas the second imprint shot region 212 is not cured.

The imprint template 100 may be configured to have a hybrid structure including the imprint portion 102 in which the imprinting patterns 121 to be transferred into each of the imprint shot regions 210 are disposed and the photomask portion 104 in which the light blocking patterns 150 defining the light permeation area 153 corresponding to the boundary region 230 are disposed.

The resist layer 200 may be formed of a material that is able to be cured by the exposure light, for example, an UV ray. The resist layer 200 may be formed of a polymer material including a photosensitizer component chemically reacting on the exposure light for example an UV ray, and a resin component. The resist layer 200 may be formed of a material which is known as an imprintable medium material in a field of an NIL technique. The resist layer 200 may be formed by spin-coating a resist material on a substrate or a wafer. Alternatively, the resist layer 200 may be formed using an ink-jetting technique or a drop-dispensing technique.

Figure 3:
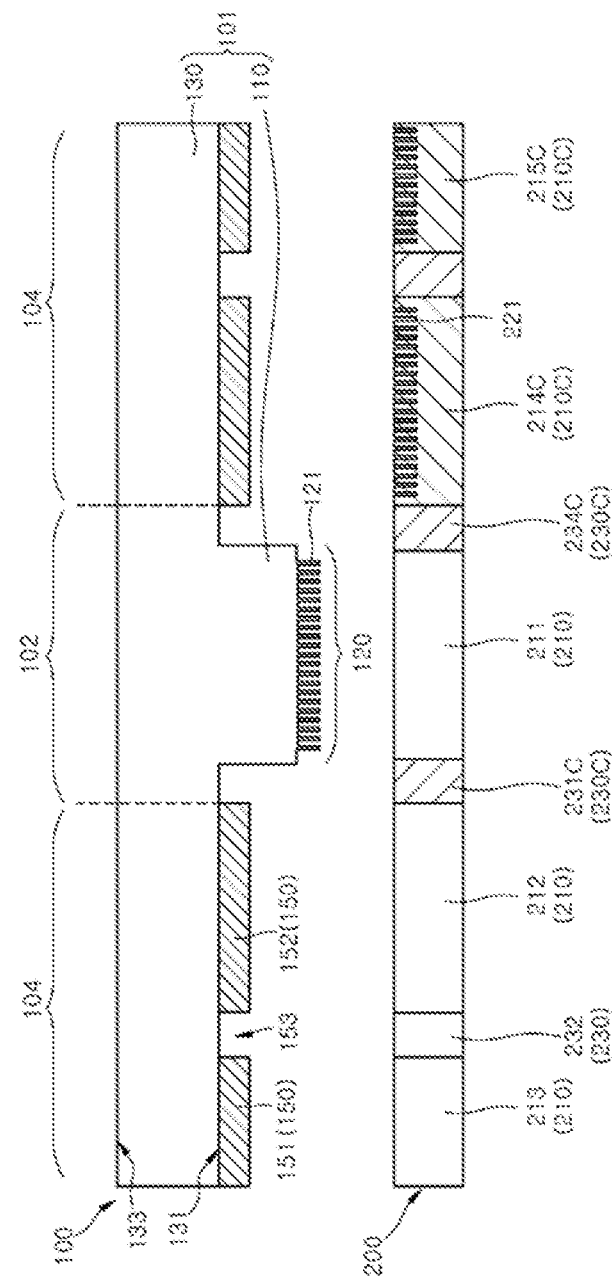
FIGS. 3 to 5 illustrate a method for forming imprinted patterns in accordance with an embodiment.
Figure 4:
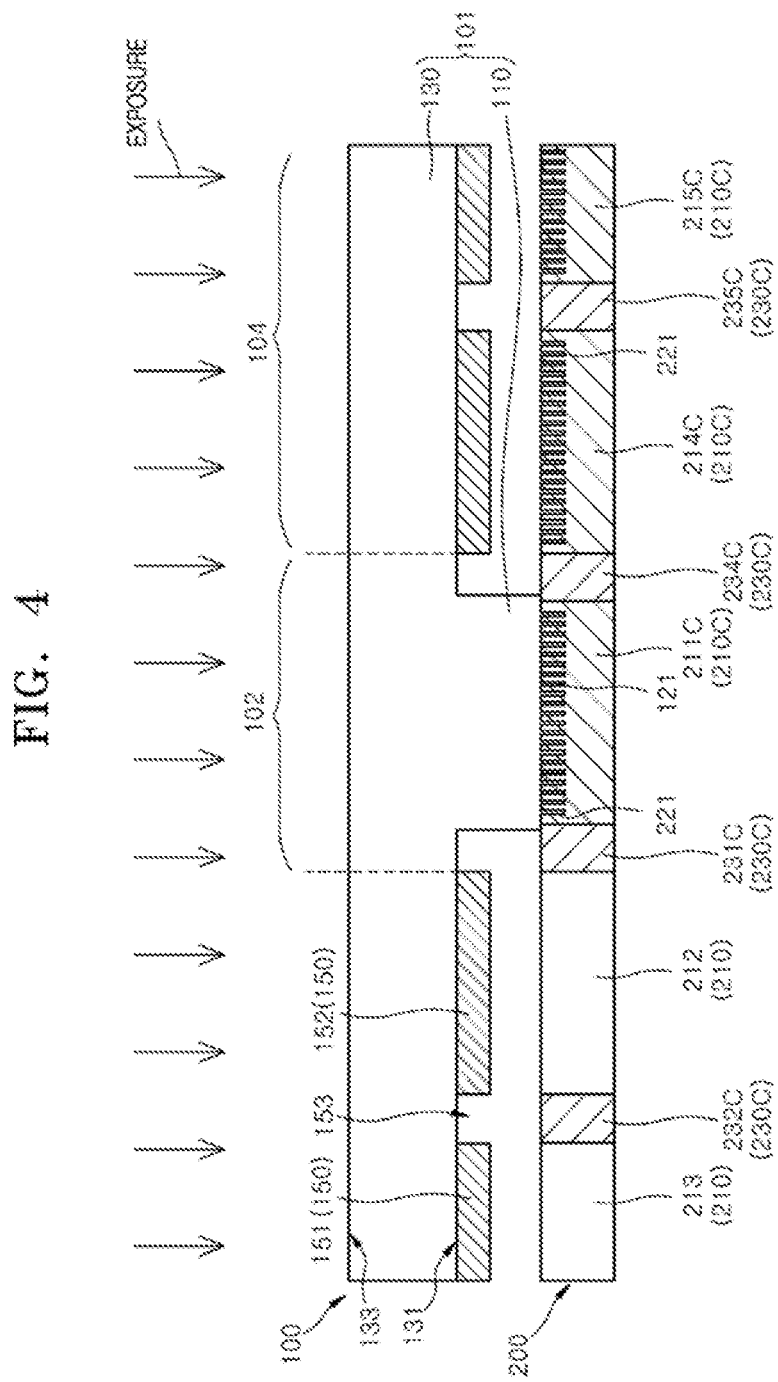
Figure 5:
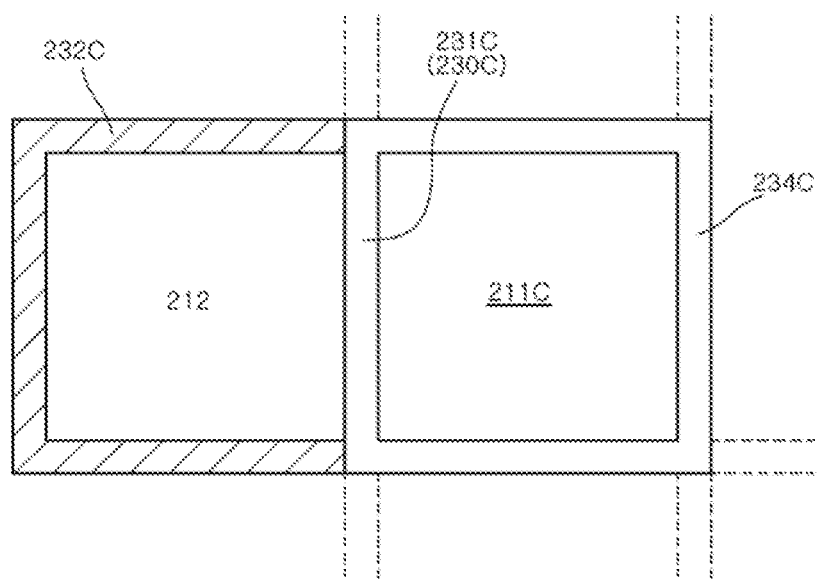
Figure 6:
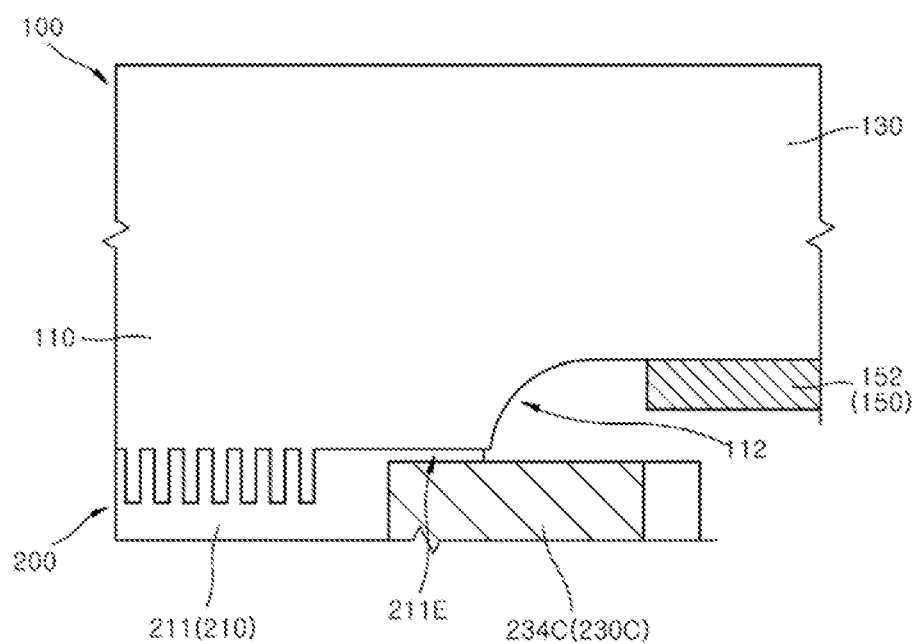
FIG. 6 is a cross-sectional view illustrating an extrusion barrier pattern formed by a method for forming imprinted patterns in accordance with an embodiment.

FIGS. 3 to 5 illustrate a method for forming imprinted patterns according to an embodiment, and FIG. 6 is a cross-sectional view illustrating an extrusion barrier pattern formed by a method for forming imprinted patterns according to an embodiment.

FIG. 3 illustrates a step of aligning the imprint template 100 with the resist layer 200. Referring to FIG. 3, the imprint template 100 may move on the resist layer 200 so that the field region 120 of the imprint template 100 is aligned with the first imprint shot region 211 of the resist layer 200. Although the first imprint shot region 211 aligned with the field region 120 is a non-cured region, first and third boundary regions, corresponding to the regions 231 and 234 of FIG. 1, defining the first imprint shot region 211 may correspond to first and third extrusion barrier patterns 231C and 234C which are cured in a previous imprint shot step for forming imprinted patterns 221 in a fourth imprint shot region 214C adjacent to the first imprint shot region 211. In such a case, even though the first and third boundary regions 231 and 234 correspond to the first and third extrusion barrier patterns 231C and 234C, the second boundary region 232 may still have a non-cured state.

The third boundary region (234 of FIG. 1) may also be cured in another previous imprint shot step for forming the imprinted patterns 221 in a fifth imprint shot region 215C, which is adjacent to a side of the fourth imprint shot region 214C opposite to the first imprint shot region 211, to provide the third extrusion barrier pattern 234C. That is, while the imprinted patterns 221 are formed in the fifth imprint shot region 215C, the third boundary region (234 of FIG. 1) may also be cured to form the third extrusion barrier pattern 234C.

In the previous imprint shot step for forming the imprinted patterns 221 in the fourth imprint shot region 214C, the first boundary region (231 of FIG. 1) may be cured to form the first extrusion barrier pattern 231C.

As described above, after the first and third extrusion barrier patterns 231C and 234C are formed, the field region 120 of the imprint template 100 may be aligned with the first imprint shot region 211 of the resist layer 200. In such a case, a portion of the light permeation area 153 of the photomask portion 104 may be aligned with the second boundary region 232 for defining the second imprint shot region 212.

Referring to FIG. 4, the imprint template 100 may move downwardly so that the imprinting patterns 121 are in contact with a surface of the first imprint shot region 211 of the resist layer 200, and the imprint template 100 may be pressed down to embed the imprinting patterns 121 into the first imprint shot region 211. While the imprinting patterns 121 are embedded into the first imprint shot region 211 of the resist layer 200, the exposure light may be irradiated onto the backside surface 133 of the imprint template 100 to perform an exposure step. The exposure light passing through the imprint portion 102 of the imprint template 100 may be irradiated onto the first imprint shot region 211 of the resist layer 200 to cure the first imprint shot region 211. As a result, the first imprint shot region 211 may be cured to form a cured first imprint shot region 211C that provides the imprinted patterns 221 having the same surface profile as the imprinting patterns 121.

While the cured first imprint shot region 211C is formed to provide the imprinted patterns 221, the exposure light passing through the light permeation area 153 of the photomask portion 104 may cure the second boundary region (232 of FIG. 1) to form a second extrusion barrier pattern 232C. As illustrated in a plane view of FIG. 5, the second extrusion barrier pattern 232C may be formed to define the second imprint shot region 212 in which the imprinting patterns 121 of the imprint template 100 are imprinted during the next imprint shot step. The second extrusion barrier pattern 232C may be formed to have a "⊏"-shaped form in a plane view to surround the second imprint shot region 212 to which the next imprint shot step is applied. The second extrusion barrier pattern 232C may be formed during the imprint shot step for forming the first imprint shot region 211C. That is, an extrusion barrier pattern 230C including the first to third extrusion barrier patterns 231C, 232C and 234C may be formed during the imprint shot steps even without any additional process step.

Referring to FIG. 6, when the imprinting patterns 121 of the imprint template 100 are imprinted into the first imprint shot region 211, a portion of the resist material in the first imprint shot region 211 may extrude out of the first imprint shot region 211. However, according to the present embodiment, since the third extrusion barrier pattern 234C is disposed to surround the first imprint shot region 211, the third extrusion barrier pattern 234C may act as a dam to prevent the resist material in the first imprint shot region 211 from extruding out of the first imprint shot region 211 while the imprinting patterns 121 of the imprint template 100 are imprinted into the first imprint shot region 211. If the resist material in the first imprint shot region 211 extrudes or flows out of the first imprint shot region 211, the uniformity of a thickness of the resist layer 200 including the imprinted patterns 221 may be degraded and an undesired extruded structure may be formed on a surface of the resist layer 200. The degradation of the thickness uniformity of the resist layer 200 or the undesired extruded structure on the surface of the resist layer 200 may cause formation of abnormal patterns. However, according to the present embodiment, the third extrusion barrier pattern 234C may prevent a portion 211E of the resist material in the first imprint shot region 211 from extruding out of the first imprint shot region 211 while the imprinting patterns 121 of the imprint template 100 are imprinted into the first imprint shot region 211. In addition according to the present embodiment, the sidewall 112 of the mesa portion 110 may not be contaminated by the resist material in the first imprint shot region 211 during the imprint shot step for the first imprint shot region 211 due to the presence of the third extrusion barrier pattern 234C.

FIGS. 7 to 14 illustrate a method for forming imprinted patterns according to another embodiment.

Figure 7:
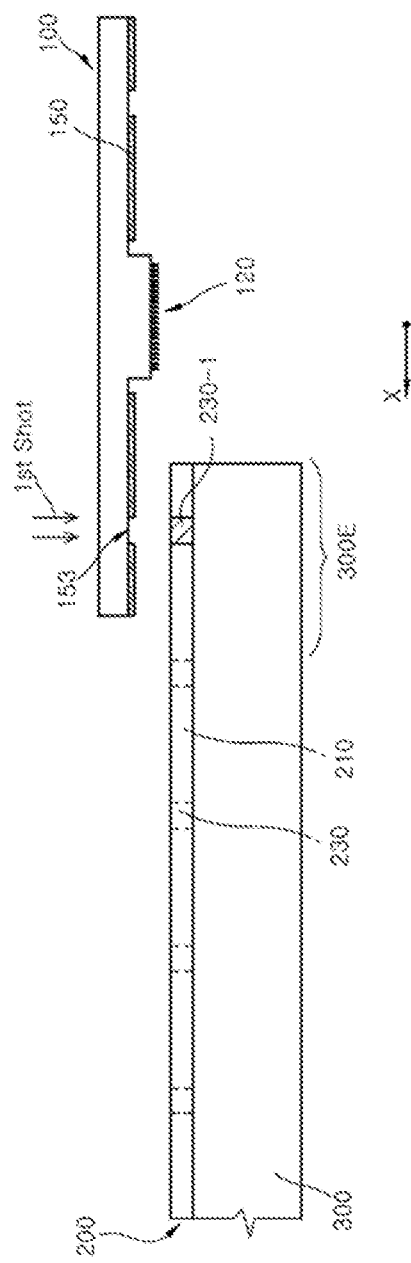
FIGS. 7 to 14 illustrate a method for forming imprinted patterns in accordance with an embodiment.
Figure 8:
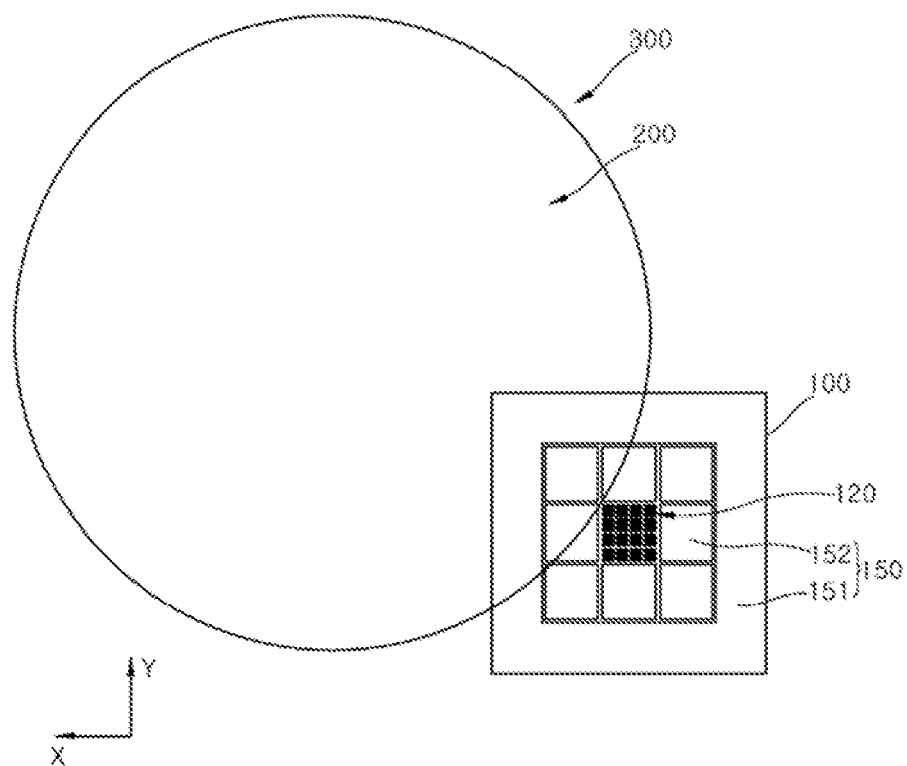

FIG. 7 is a cross-sectional view illustrating a first exposure shot step applied to an edge portion 300E of a wafer 300, and FIG. 8 is a plane view illustrating the first exposure shot step. Referring to FIGS. 7 and 8, the resist layer 200 may be formed on the wafer 300. The imprint template 100 may then be aligned with the wafer 300 so that a portion of the edge portion 300E of the wafer 300 overlaps with a portion of the imprint template 100, and an exposure light may be irradiated onto the resist layer 200 through the light permeation area 153 of the imprint template 100 to perform the first exposure shot step. As illustrated in FIG. 8, the imprint template 100 may be aligned with the wafer 300 so that some of the light blocking patterns 150 of the imprint template 100 overlaps with the wafer 300 and the field region 120 of the imprint template 100 does not overlap with the wafer 300. A first boundary region of the resist layer 200 may be selectively exposed and cured by the exposure light passing through the light permeation area 153 of the imprint template 100 to form a first extrusion barrier pattern 230-1.

Figure 9:
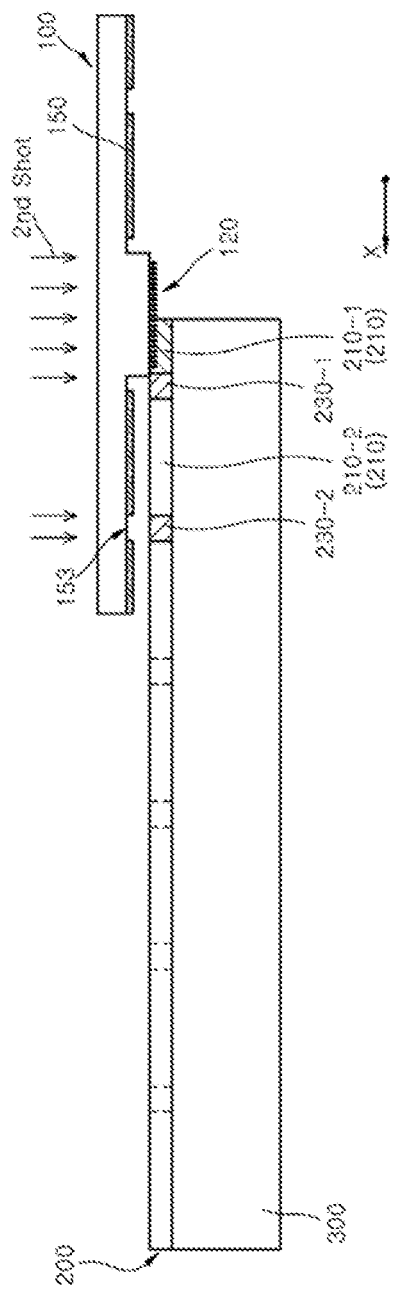
Figure 10:
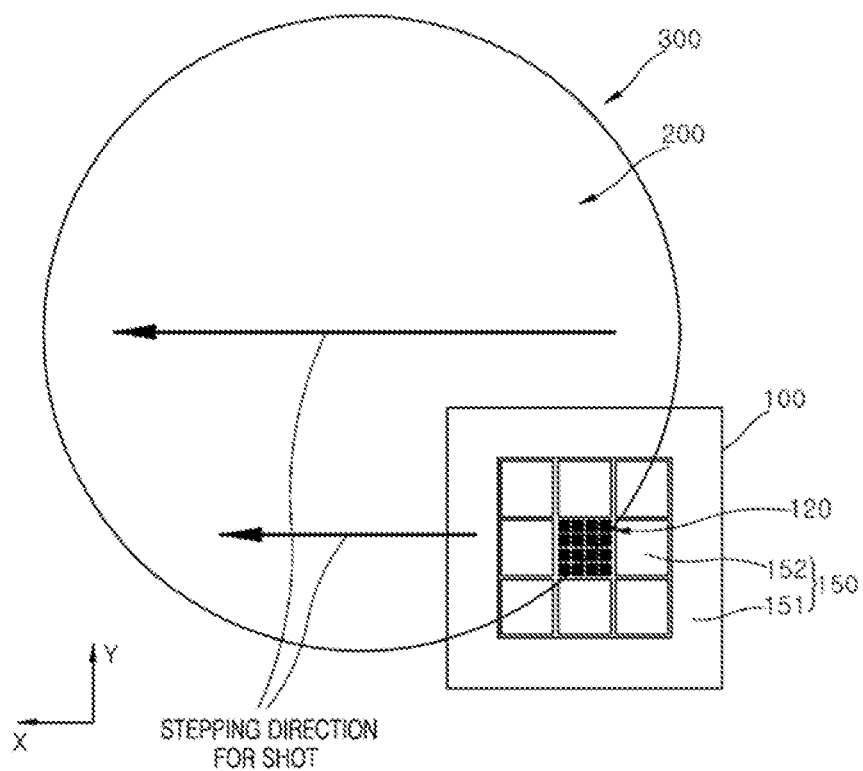

FIG. 9 is a cross-sectional view illustrating a second exposure shot step applied to the wafer 300, and FIG. 10 is a plane view illustrating the second exposure shot step. Referring to FIGS. 9 and 10 the imprint template 100 may be shifted toward an inner portion of the wafer 300 so that the field region 120 of the imprint template 100 is partially aligned with a first imprint shot region 210-1 of the resist layer 200, which is defined by the first extrusion barrier pattern 230-1. The imprint template 100 may be shifted in an X-axis direction to perform the second exposure shot step. After the second exposure shot step is performed, the imprint template 100 may be sequentially stepped in the X-axis direction to perform a plurality of exposure shot steps in a single row of the wafer 300. After the plurality of exposure shot steps are performed along the single row of the wafer 300, the imprint template 100 may be shifted toward a Y-axis direction and the imprint template 100 may be sequentially stepped in the X-axis direction to perform a plurality of exposure shot steps in another single row of the wafer 300. A plurality of exposure shot steps may be applied to an entire portion of the wafer 300 using the above stepping manner. In some embodiments, the wafer 300 instead of the imprint template 100 may be sifted to apply the exposure shot steps to an entire portion of the wafer 300.

The first imprint shot region 210-1 may correspond to a region between an edge of the wafer 300 and the first extrusion barrier pattern 230-1. Thus, only a portion of the field region 120 of the imprint template 100 may overlap with the first imprint shot region 210-1. The imprint template 100 may move downwardly so that the imprinting patterns 121 of the imprint template 100 are in contact with a surface of the first imprint shot region 210-1 of the resist layer 200, and the imprint template 100 may be pressed down to embed the imprinting patterns 121 into the first imprint shot region 210-1. While the imprinting patterns 121 are embedded into the first imprint shot region 210-1 of the resist layer 200, the second exposure shot step may be performed to cure the first imprint shot region 210-1. Accordingly, the cured first imprint shot region 210-1 may be hardened to have the same surface profile as the imprinting patterns 121.

During the second exposure shot step, the exposure light template 100 may be irradiated onto a second boundary region of the resist layer 200 to form a second extrusion barrier pattern 230-2. The second extrusion barrier pattern 230-2 may be formed to define a second imprint shot region 210-2 adjacent to the cured first imprint shot region 210-1. During the second exposure shot step, one of the light blocking patterns 150 of the imprint template 100 may cover the second imprint shot region 210-2. Thus, the second imprint shot region 210-2 may not be exposed to the exposure light during the second exposure shot step. That is, the second imprint shot region 210-2 may correspond to a non-cured region.

Figure 11:
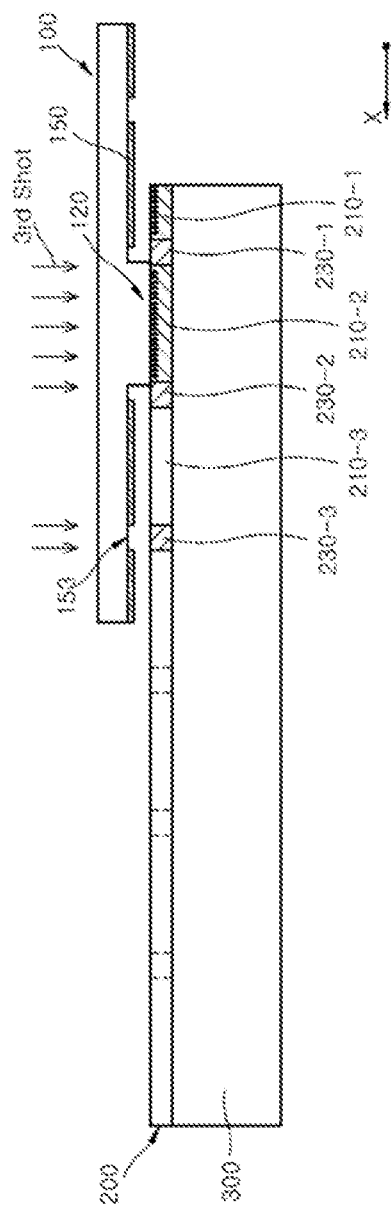
Figure 12:
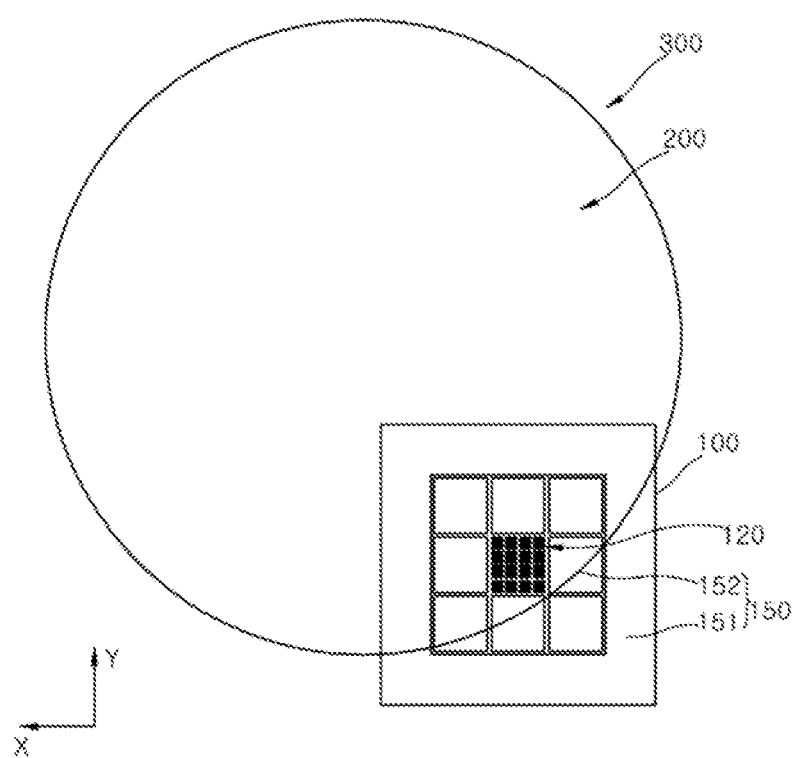

FIG. 11 is a cross-sectional view illustrating a third exposure shot step applied to the wafer 300, and FIG. 12 is a plane view illustrating the third exposure shot step. Referring to FIGS. 11 and 12, the imprint template 100 may be shifted toward an inner portion of the wafer 300 in the X-axis direction so that the field region 120 of the imprint template 100 is aligned with the second imprint shot region 210-2 of the resist layer 200, which is defined by the second extrusion barrier pattern 230-2. The second imprint shot region 210-2 may be defined as a region between the first and second extrusion barrier patterns 230-1 and 230-2. The imprint template 100 may move downwardly so that the imprinting patterns 121 of the imprint template 100 are in contact with a surface of the second imprint shot region 210-2 of the resist layer 200, and the imprint template 100 may be pressed down to embed the imprinting patterns 121 into the second imprint shot region 210-2. While the imprinting patterns 121 are embedded into the second imprint shot region 210-2 of the resist layer 200, the third exposure shot step may be performed to cure the second imprint shot region 210-2. Accordingly, the cured second imprint shot region 210-2 may be hardened to have the same surface profile as the imprinting patterns 121.

During the third exposure shot step, the exposure light passing through the light permeation area 153 of the imprint template 100 may be irradiated onto a third boundary region of the resist layer 200 to form a third extrusion barrier pattern 230-3. The third extrusion barrier pattern 230-3 may be formed to define a third imprint shot region 210-3 adjacent to the cured second imprint shot region 210-2. During the third exposure shot step, one of the light blocking patterns 150 of the imprint template 100 may cover the third imprint shot region 210-3. Thus, the third imprint shot region 210-3 may not be exposed to the exposure light during the third exposure shot step. That is, the third imprint shot region 210-3 may correspond to a non-cured region.

Figure 13:
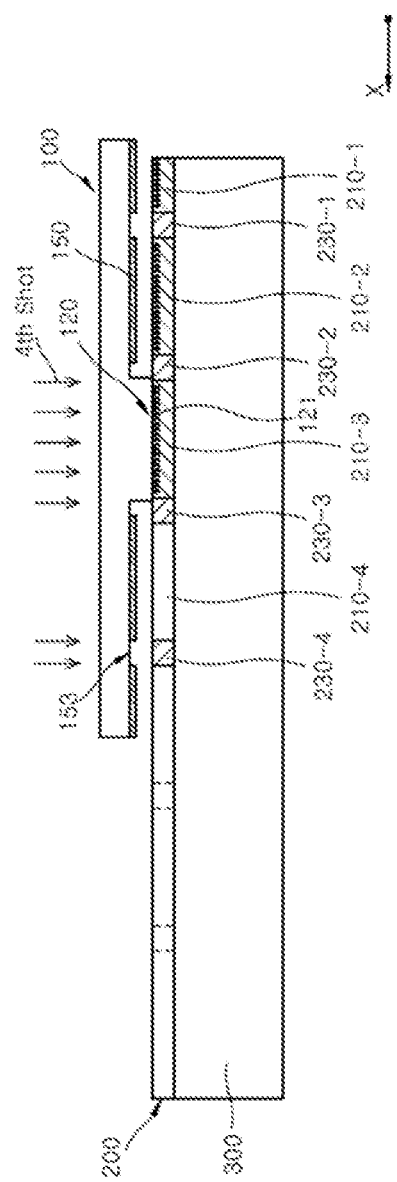
Figure 14:
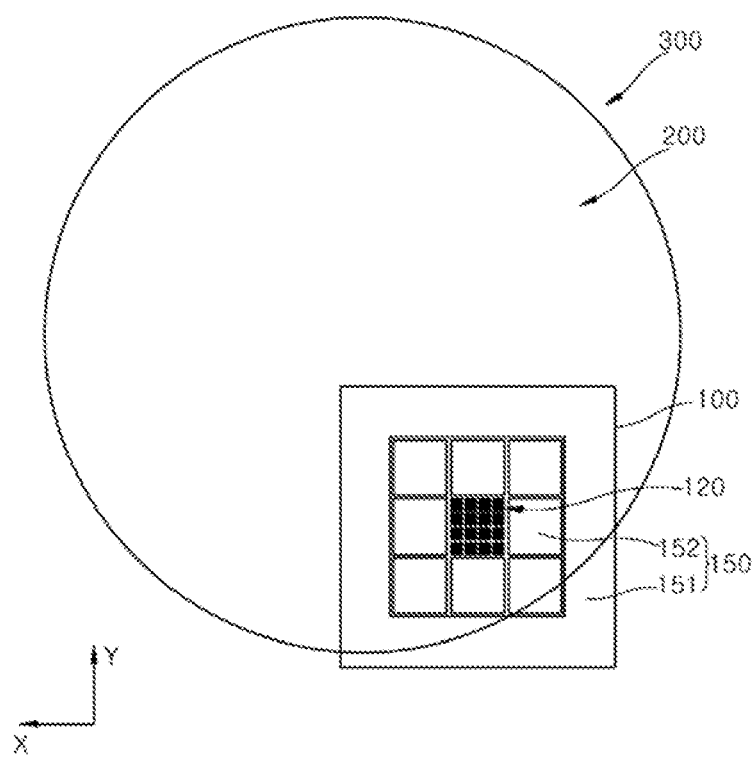

FIG. 13 is a cross-sectional view illustrating a fourth exposure shot step applied to the wafer 300, and FIG. 14 is a plane view illustrating the fourth exposure shot step. Referring to FIGS. 13 and 14, the imprint template 100 may be shifted towards an inner portion of the wafer 300 in the X-axis direction so that the field region 120 of the imprint template 100 is aligned with the third imprint shot region 210-3 of the resist layer 200, which is defined by the third extrusion barrier pattern 230-3. The third imprint shot region 210-3 may be defined as a region between the second and third extrusion barrier patterns 230-2 and 230-3. The imprint template 100 may move downwardly so that the imprinting patterns 121 of the imprint template 100 are in contact with a surface of the third imprint shot region 210-3 of the resist layer 200, and the imprint template 100 may be pressed down to embed the imprinting patterns 121 into the third imprint shot region 210-3. While the imprinting patterns 121 are embedded into the third imprint shot region 210-3 of the resist layer 200, the fourth exposure shot step may be performed to cure the third imprint shot region 210-3. Accordingly, the cured third imprint shot region 210-3 may be hardened to have the same surface profile as the imprinting patterns 121.

During the fourth exposure shot step, the exposure light passing through the light permeation area 153 of the imprint template 100 may be irradiated onto a fourth boundary region of the resist layer 200 to form a fourth extrusion barrier pattern 230-4. The fourth extrusion barrier pattern 230-4 may be formed to define a fourth imprint shot region 210-4 adjacent to the cured third imprint shot region 210-3. During the fourth exposure shot step, one of the light blocking patterns 150 of the imprint template 100 may cover the fourth imprint shot region 210-4. Thus, the fourth imprint shot region 210-4 may not be exposed to the exposure light during the fourth exposure shot step. That is, the fourth imprint shot region 210-4 may correspond to a non-cured region.

A shape of the imprinting patterns 121 may be transferred into an entire portion of the resist layer 200 by repeatedly performing the imprint shot steps and the exposure shot steps which are described above.

Figure 15:
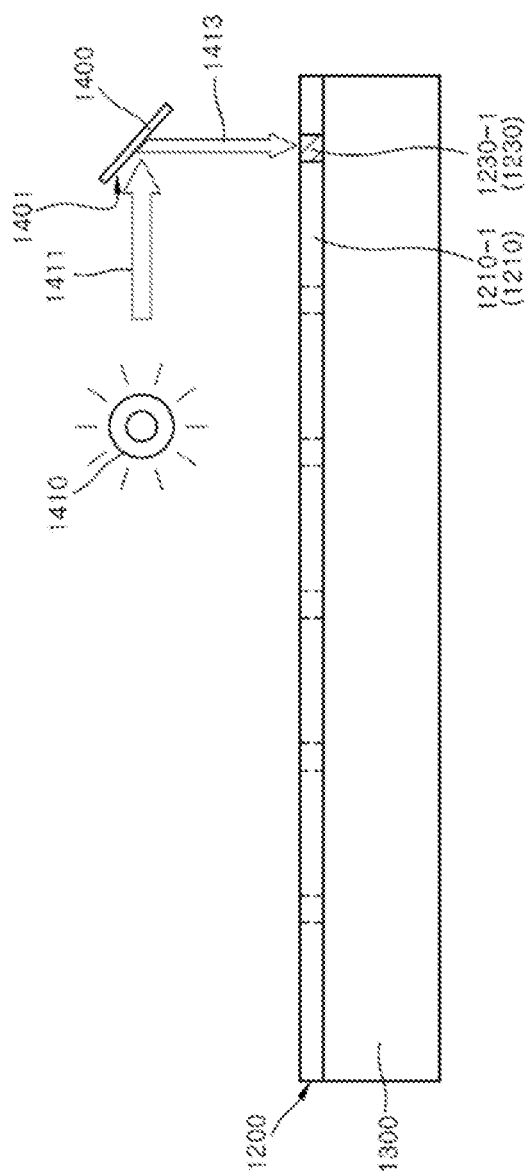
FIGS. 15 and 16 illustrate a method for forming imprinted patterns in accordance with an embodiment.
Figure 16:
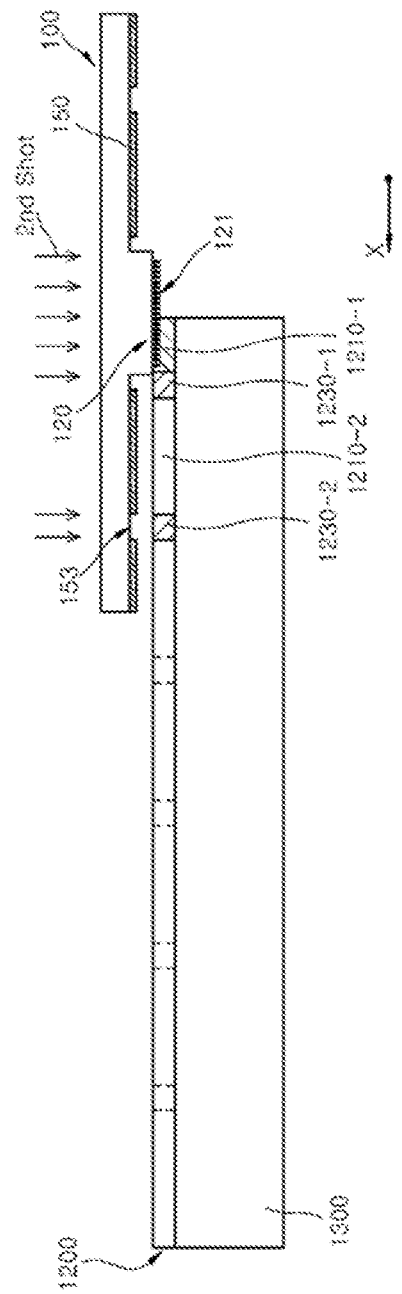

FIGS. 15 and 16 are cross-sectional views illustrating a method for forming imprinted patterns according to yet another embodiment.

FIG. 15 is a cross-sectional view illustrating a first exposure shot step applied to an edge portion of a wafer 1300. Referring to FIG. 15, an exposure light may be directly irradiated onto a first boundary region of a resist layer 1200 formed on a wafer 1300 without using any imprint template to perform the first exposure shot step. As a result of the first exposure shot step, a first extrusion barrier pattern 1230-1 may be formed in the resist layer 1200. The first extrusion barrier pattern 1230-1 among a plurality of extrusion barrier patterns 1230 may be formed to be adjacent to an edge of the wafer 1300. A first imprint shot region 1210-1 may be defined as a region between the first extrusion barrier pattern 1230-1 and an edge of the wafer 1300.

The first exposure shot step may be performed by a direct exposure step using a digital micro-mirror device (DMD) 1400. For example, a primary exposure light 1411 generated by a light source 1410 may travel toward a mirror surface 1401 of the DMD 1400, and the DMD 1400 may reflect the primary exposure light 1411 to generate a secondary exposure light 1413 which is irradiated onto the first boundary region of the resist layer 1200. A travelling path of the secondary exposure light 1413 may be controlled by an array of micro-mirrors of the DMD 1400 so that the secondary exposure light 1413 is irradiated only onto the first boundary region of the resist layer 1200. The DMD 1400 may perform a maskless exposure step using an array of the micro-mirrors. The DMD 1400 may control an array of the micro-mirrors to accurately adjust a position of the resist layer 1200, onto which the secondary exposure light 1413 is irradiated. Accordingly, a location of the first extrusion barrier pattern 1230-1 formed in the resist layer 1200 may be accurately controlled.

A second exposure shot step may be applied to the first imprint shot region 1210-1 which is defined by the first extrusion barrier pattern 1230-1. As illustrated in FIG. 16, the imprint template 100 may then be loaded on the wafer 1300 so that the field region 120 of the imprint template 100 is aligned with the first imprint shot region 1210-1 of the resist layer 1200. The imprint template 100 may move downwardly so that the imprinting patterns 121 of the imprint template 100 are in contact with a surface of the first imprint shot region 1210-1 of the resist layer 1200, and the imprint template 100 may be pressed down to embed the imprinting patterns 121 into the first imprint shot region 1210-1. While the imprinting patterns 121 are embedded into the first imprint shot region 1210-1 of the resist layer 1200, the second exposure shot step may be performed to cure the first imprint shot region 1210-1. Accordingly, the cured first imprint shot region 1210-1 may be hardened to have the same surface profile as the imprinting patterns 121.

During the second exposure shot step, the exposure light passing through the passing through the light permeation area 153 of the imprint template 100 may be irradiated onto a second boundary region of the resist layer 1200 to form a second extrusion barrier pattern 1230-2. The second extrusion barrier pattern 1230-2 may be formed to define a second imprint shot region 1210-2 adjacent to the cured first imprint shot region 1210-1. During the second exposure shot step, one the light blocking patterns 150 of the imprint template 100 may cover the second imprint shot region 1210-2. Thus, the second imprint shot region 1210-2 may not be exposed to the exposure light during the second exposure shot step. That is, the second imprint shot region 1210-2 may correspond to a non-cured region. Subsequently, additional exposure shot steps may be sequentially performed using the same manner as described with reference to FIGS. 10 to 14.

Although the embodiments of the present disclosure have been described with reference to the accompanying drawings, the embodiments described above are for illustrative purposes only and are not intended to limit the scope of the present disclosure. Accordingly, those skilled in the art will appreciate that various modifications, additions and substitutions are possible, without departing from the scope and spirit of the present disclosure and the accompanying claims.

What is claimed is:

1. A method for forming imprinted patterns, the method comprising:
   loading an imprint template on a resist layer, wherein the imprint template includes an imprint portion in which imprinting patterns are disposed and a photomask portion in which light blocking patterns are disposed to provide a light permeation area between the light blocking patterns;
   performing a first imprint step to embed the imprinting patterns into a first imprint shot region of the resist layer; and
   irradiating an exposure light onto the imprint template to cure the first imprint shot region with the exposure light passing through the imprint portion of the imprint template and to cure a boundary region of the resist layer defining a second imprint shot region of the resist layer with the exposure light passing through the light permeation area to form an extrusion barrier pattern,
   wherein the light blocking patterns include a plurality of first light blocking patterns disposed to surround a field region comprised of the imprinting patterns and a second light blocking pattern disposed to surround an array of the plurality of first light blocking patterns to have a frame-shaped feature in a plane view.

2. The method of claim 1, further comprising:
   shifting the imprint template to align the imprinting patterns of the imprint template with the second imprint shot region; and
   performing a second imprint step to embed the imprinting patterns into the second imprint shot region of the resist layer.

3. The method of claim 2, further comprising irradiating an exposure light onto the imprint template to cure the second imprint shot region with the exposure light passing through the imprint portion of the imprint template and to cure another boundary region of the resist layer defining a third imprint shot region of the resist layer with the exposure light passing through the light permeation area to form another extrusion barrier pattern.

4. The method of claim 1, wherein the imprint template includes a base portion on which the light blocking patterns are disposed and a mesa portion protruding from a portion of the base portion to have a patterned surface providing the imprinting patterns.

5. The method of claim 1, wherein any one of the first light blocking patterns is located to overlap with the second imprint shot region of the resist layer if the field region is aligned with the first imprint shot region.

6. The method of claim 1, wherein the light permeation area is comprised of a space between adjacent two of the first light blocking patterns as well as a space between adjacent two of the first and the second blocking patterns to have a grid shape in a plane view.

7. The method of claim 1, wherein each of the first light blocking patterns has substantially the same planar shape as the field region.

8. The method of claim 1, wherein a portion of the light permeation area is located to correspond to the boundary region defining the second imprint shot region as a next imprint shot region adjacent to the first imprint shot region.

9. A method for forming imprinted patterns, the method comprising:
   forming a resist layer on a wafer;

providing an imprint template including an imprint portion in which imprinting patterns are disposed and a photomask portion in which light blocking patterns are disposed to provide a light permeation area between the light blocking patterns;

aligning the imprint template with the wafer so that the light permeation area vertically overlaps with an edge portion of the wafer and the imprinting patterns are located outside of the wafer without vertically overlapping with the wafer;

curing a boundary region of the resist layer with an exposure light passing through the light permeation area to form a first extrusion barrier pattern defining a first imprint shot region in the resist layer;

realigning the imprint template with the wafer so that the imprinting patterns are located over the first imprint shot region;

performing a first imprint step to embed the imprinting patterns into the first imprint shot region; and irradiating the exposure light onto the imprint template to cure the first imprint shot region with the exposure light passing through the imprint portion of the imprint template and to cure another boundary region of the resist layer defining a second imprint shot region of the resist layer with the exposure light passing through the light permeation area to form a second extrusion barrier pattern.

10. A method for forming imprinted patterns, the method comprising:

forming a resist layer on a wafer;

irradiating an exposure light onto a boundary region of the resist layer using a digital micro-mirror device (DMD) to form a first extrusion barrier pattern defining a first imprint shot region in the resist layer;

providing an imprint template including an imprint portion in which imprinting patterns are disposed and a photomask portion in which light blocking patterns are disposed to provide a light permeation area between the light blocking patterns;

aligning the imprint template with the wafer so that the imprinting patterns are located over the first imprint shot region;

performing a first imprint step to embed the imprinting patterns into the first imprint shot region; and irradiating the exposure light onto the imprint template to cure the first imprint shot region with the exposure light passing through the imprint portion of the imprint template and to cure another boundary region of the resist layer defining a second imprint shot region of the resist layer with the exposure light passing through the light permeation area to form a second extrusion barrier pattern.

11. The method of claim 10, wherein the first imprint shot region is defined as a region between the first extrusion barrier pattern and an edge of the wafer.

12. The method of claim 10, further comprising:

shifting the imprint template to align the imprinting patterns of the imprint template with the second imprint shot region; and performing a second imprint step to embed the imprinting patterns into the second imprint shot region of the resist layer.

* * * * *